US009480189B2

(12) United States Patent
Kawai et al.

(10) Patent No.: US 9,480,189 B2
(45) Date of Patent: Oct. 25, 2016

(54) ELECTRONIC CONTROL APPARATUS

(71) Applicant: Hitachi Automotive Systems, Ltd., Hitachinaka-shi, Ibaraki (JP)

(72) Inventors: Yoshio Kawai, Hitachinaka (JP); Hironori Ohhashi, Isesaki (JP); Yuuichi Yanagisawa, Maebashi (JP); Kumiko Yoshinaga, Ota (JP); Eiji Ichikawa, Isesaki (JP)

(73) Assignee: Hitachi Automotive Systems, Ltd., Hitachinaka-shi (JP)

( * ) Notice: Subject to any disclaimer, the term of this patent is extended or adjusted under 35 U.S.C. 154(b) by 0 days.

(21) Appl. No.: 14/424,099

(22) PCT Filed: Sep. 12, 2013

(86) PCT No.: PCT/JP2013/074678
§ 371 (c)(1),
(2) Date: Feb. 26, 2015

(87) PCT Pub. No.: WO2014/046004
PCT Pub. Date: Mar. 27, 2014

(65) Prior Publication Data
US 2015/0216088 A1    Jul. 30, 2015

(30) Foreign Application Priority Data
Sep. 21, 2012    (JP) .................... 2012-208927

(51) Int. Cl.
*H05K 7/20* (2006.01)
*H01L 23/367* (2006.01)
(Continued)

(52) U.S. Cl.
CPC ....... *H05K 7/20854* (2013.01); *H01L 23/3675* (2013.01); *H05K 1/0203* (2013.01); *H05K 7/20409* (2013.01); *H01L 2924/0002* (2013.01)

(58) Field of Classification Search
CPC ............................ G06F 1/181–1/182; H05K 7/20218–7/20381; H05K 7/20409–7/20418; H05K 7/20009–7/202; H01L 23/367–23/3677; H01L 23/473; H01L 23/46–23/467
USPC ....................... 361/676–678, 679.46–679.54, 361/688–723; 165/80.1–80.5, 104.33, 185; 174/15.1–15.3, 16.1–16.3, 547, 548; 257/712–722, E23.088; 24/453, 24/458–459; 454/184; 312/236
See application file for complete search history.

(56) References Cited

U.S. PATENT DOCUMENTS 6,067,223 A * 5/2000 Diebel .................. H02B 1/56
165/104.33
6,198,631 B1 * 3/2001 Radosavljevic ....... H05B 39/00
165/185

(Continued)

FOREIGN PATENT DOCUMENTS

JP    2006-86536 A    3/2006
JP    2009-54701 A    3/2009

(Continued)

OTHER PUBLICATIONS

International Search Report (PCT/ISA/210) dated Oct. 8, 2013 with English-language translation (Four (4) pages).

(Continued)

*Primary Examiner* — Anthony Haughton
*Assistant Examiner* — Razmeen Gafur
(74) *Attorney, Agent, or Firm* — Crowell & Moring LLP (57) ABSTRACT

A heat-generating component (3) is mounted on a surface (4b), on a case (12) side, of a circuit board (4). A recessed portion (5) is formed in a position facing the heat-generating component (3), on an inner wall surface (12e) side of a bottom wall (12a) of the case (12). Between an inner wall surface (5a) of this recessed portion (5) and the heat-generating component (3), a predetermined-sized component clearance (Ca) is provided, and a heat radiation member (6) is interposed in a position of the component clearance (Ca). A peripheral clearance (Cb) is provided between the surface (4b), on the case (12) side, of the circuit board (4) and the inner wall surface (12e) of the bottom wall (12a) of the case (12) on a peripheral edge side of the recessed portion (5).

4 Claims, 6 Drawing Sheets (51) Int. Cl.
*H05K 1/02* (2006.01)
*H01L 23/473* (2006.01)

(56) References Cited

U.S. PATENT DOCUMENTS

| | | | | |
|---|---|---|---|---|
| 7,265,978 | B2* | 9/2007 | Suzuki | F16H 57/0415 |
| | | | | 165/80.4 |
| 7,400,239 | B2* | 7/2008 | Kiko | H01H 9/161 |
| | | | | 200/1 R |
| 7,477,513 | B1* | 1/2009 | Cader | H01L 23/4735 |
| | | | | 165/80.4 |
| 7,621,723 | B2* | 11/2009 | Okubo | F04B 17/044 |
| | | | | 361/699 |
| 7,751,193 | B2* | 7/2010 | Tominaga | H05K 3/32 |
| | | | | 165/185 |
| 8,427,091 | B2* | 4/2013 | Cheng | H02P 3/18 |
| | | | | 257/714 |
| 8,659,130 | B2* | 2/2014 | Takagi | H01L 23/3675 |
| | | | | 257/675 |
| 8,687,357 | B2* | 4/2014 | Nagano | H05K 7/20918 |
| | | | | 165/104.33 |
| 8,797,742 | B2 | 8/2014 | Kawai et al. | |
| 2005/0088831 | A1* | 4/2005 | Lin | H05K 7/209 |
| | | | | 361/752 |
| 2005/0286223 | A1* | 12/2005 | Morales | H05K 7/20145 |
| | | | | 361/690 |
| 2006/0158852 | A1* | 7/2006 | Thomas | H05K 7/20445 |
| | | | | 361/704 |
| 2006/0232942 | A1* | 10/2006 | Nakatsu | B60L 11/08 |
| | | | | 361/710 |
| 2006/0279927 | A1* | 12/2006 | Strohm | F04D 29/023 |
| | | | | 361/695 |
| 2006/0289664 | A1* | 12/2006 | Tomikawa | B60R 16/0239 |
| | | | | 237/12.3 R |
| 2007/0165376 | A1* | 7/2007 | Bones | H01L 25/162 |
| | | | | 361/688 |
| 2008/0007919 | A1* | 1/2008 | Isomoto | H02M 7/003 |
| | | | | 361/709 |
| 2008/0158823 | A1* | 7/2008 | Tominaga | B60R 16/0239 |
| | | | | 361/709 |
| 2008/0278918 | A1* | 11/2008 | Tominaga | B62D 5/0406 |
| | | | | 361/719 |
| 2009/0201641 | A1* | 8/2009 | Guo | G06F 1/20 |
| | | | | 361/694 |
| 2011/0188200 | A1* | 8/2011 | Takahashi | B61C 17/00 |
| | | | | 361/690 |
| 2011/0205706 | A1* | 8/2011 | Higashibata | B60R 16/0239 |
| | | | | 361/699 |
| 2011/0228478 | A1* | 9/2011 | Takata | F16H 61/0006 |
| | | | | 361/699 |
| 2011/0228498 | A1 | 9/2011 | Kawai et al. | |
| 2011/0235278 | A1 | 9/2011 | Hara | |
| 2012/0250254 | A1* | 10/2012 | Kojyo | H05K 7/20918 |
| | | | | 361/692 |

FOREIGN PATENT DOCUMENTS

JP 2011-192937 A 9/2011
WO WO 2010/067725 A1 6/2010

OTHER PUBLICATIONS

Japanese Office Action dated Jun. 16, 2015 (three (3) pages).

* cited by examiner

ELECTRONIC CONTROL APPARATUS

TECHNICAL FIELD

The present invention relates to an electronic control apparatus for a vehicle which accommodates a circuit board in a protective space inside an enclosure of the electronic control apparatus.

BACKGROUND ART

An electronic control apparatus generally used for an engine control unit, an automatic transmission control unit and the like, mounted in a vehicle, has a structure in which a circuit board on which various electronic components are mounted is accommodated in a protective space (a waterproof space) inside an enclosure that is formed by connecting a plurality of enclosure members together. On this circuit board, besides the electronic component such as a capacitor, a heat-generating electronic component (hereinafter, a heat-generating component) such as a central processing unit (CPU) and a semiconductor switching element, which generates heat by its operation, is mounted.

As a method of radiating heat in the enclosure, which is generated by such heat-generating component, to the outside, a structure or configuration in which the heat generated by the heat-generating component is conducted to an inner wall surface of the enclosure member and the heat is radiated from an outer wall surface of the enclosure member into the air is adopted, then a method of suppressing high-temperature of the heat-generating component using this structure is employed. As this structure or configuration, there has been known a method in which a protruding portion that is a protuberance (or protrusion) protruding from a position on an inner wall surface side of the enclosure member, which faces the heat-generating component, toward the heat-generating component and located close to the heat-generating component (through a clearance) is formed, or a heat radiation member such as heat radiating material is interposed between the protruding portion and the heat-generating component (for instance, Patent Document 1).

CITATION LIST

Patent Document

Patent Document 1: Japanese Patent Application Publication No. JP2006-86536

SUMMARY OF THE INVENTION

Inventors of the present invention found that the structure, in which, as described above, the protruding portion is formed on the inner wall surface side of the enclosure member so as to be located close to the heat-generating component or the heat radiation member is interposed between the protruding portion and the heat-generating component, is a mere structure that facilitates the heat conduction from the heat-generating component to the enclosure member side, and there is a possibility that the heat radiation from the outer wall surface side of the enclosure member into the air will not be adequately carried out.

The present invention was made in view of the above technical problem, and provides an electronic control apparatus that is capable of improving heat radiation performance. The electronic control apparatus according to the present invention can solve the above technical problem. As an embodiment of the present invention, an electronic control apparatus accommodating, in a space inside an enclosure formed by connecting a plurality of enclosure members together, a circuit board on which at least one heat-generating electronic component that generates heat is mounted, comprises: a recessed portion formed in a position facing the heat-generating electronic component in the enclosure member that faces the heat-generating electronic component.

According to the present invention, the heat from the heat-generating component is easily conducted to the enclosure member side through the recessed portion, and a clearance of a peripheral edge side of the heat-generating component between the enclosure member and the circuit board can be narrow, thereby improving the heat radiation performance.

EMBODIMENTS FOR CARRYING OUT THE INVENTION

An electronic control apparatus according to embodiments of the present invention is an electronic control apparatus in which a circuit board on which a heat-generating component is mounted is accommodated in a space inside an enclosure that is formed by connecting a plurality of enclosure members together. Further, the electronic control apparatus of the present invention is not an electronic control apparatus like the related art as mentioned above in which the protruding portion is formed in the position on the inner wall surface side of the enclosure member, which faces the heat-generating component, so as to protrude toward the heat-generating component and so as to be located close to the heat-generating component (through the clearance), but an electronic control apparatus in which a recessed portion is formed in the position facing the heat-generating component.

Figure 13:
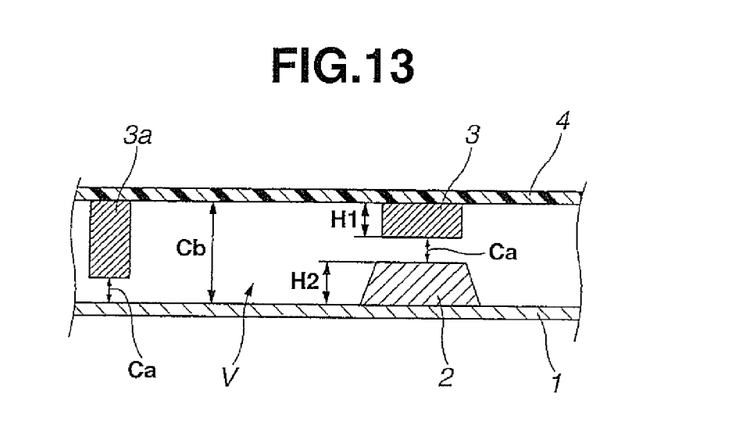
FIG. 13 is an explanatory drawing showing an example of a related art electronic control apparatus.

In a case of technical idea like the related art in which the protruding portion is formed, in order that the protruding portion does not interfere with (does not touch) the heat-generating component and also a highest component (hereinafter, called a clearance target component) among various electronic components (including the heat-generating component) mounted on the circuit board and the enclosure member do not interfere with each other, a method, in which a clearance (a gap; hereinafter, called a component clearance) is given between a top end portion of the protruding portion and the heat-generating component and between the clearance target component and the enclosure member, and a heat radiation member is interposed in the clearance of the heat-generating component, is employed. However, in the case of the method of this related art, for instance, as shown in FIG. 13, when a component clearance Ca is provided between a clearance target component 3a and an enclosure member 1, a clearance (hereinafter, called a peripheral clearance) Cb is also formed in a part where the various electronic components are not mounted (in FIG. 13, at peripheral edge sides of a heat-generating component 3 and the clearance target component 3a). Then, a protruding portion 2 is provided in a position on an inner wall surface side of the enclosure member 1, which faces the heat-generating component 3 that is lower than the clearance target component 3a, so as to secure the component clearance Ca between the protruding portion 2 and the heat-generating component 3. A height H2 of this protruding portion 2 is set by calculating a size obtained by subtracting a height H1 of the heat-generating component 3 and the component clearance Ca from the peripheral clearance Cb.

Thus, in the case of the method of the related art, an area of the peripheral clearance Cb exists also at the peripheral edge side of the heat-generating component 3 that is lower than the clearance target component 3a, and a large hollow V is formed in this area of the peripheral clearance Cb. Since this hollow V is a mere air space and has low heat conductivity as compared to the enclosure member 1, if a volume of the hollow V is large, there is a risk that the heat radiation performance will be deteriorated.

Figure 14:
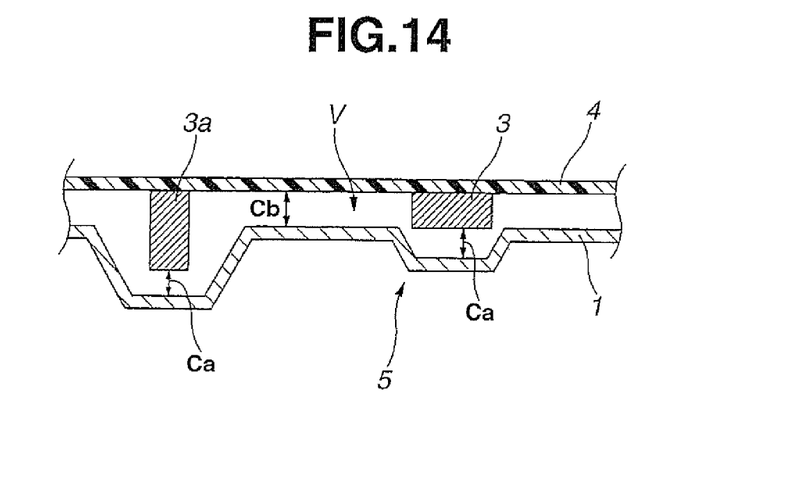
FIG. 14 is an explanatory drawing showing an example of the recessed portion according to the present embodiment.

On the other hand, according to a structure or configuration of the present embodiments, as shown in FIG. 14, the component clearance Ca is secured between an inner wall surface of a recessed portion 5 and the heat-generating component 3. This recessed portion 5 is not only formed so as to face the heat-generating component 3 as mentioned above, but also could be formed in a position facing the various electronic components (such as the clearance target component 3a). For instance, in a structure in which a top end portion of the heat-generating component 3 is located in an opening position of the recessed portion 5 as shown in the drawing, in a case where the peripheral clearance Cb is set with a size (a distance) from the opening position (an opening edge) of the recessed portion 5 to a circuit board 4 being a reference then at least a part (top end portion side) of the heat-generating component 3 is positioned in the recessed portion 5 and encircled and wrapped with the inner wall surface of the recessed portion 5, it is possible to set the peripheral clearance Cb to be even narrower. That is, as compared with the peripheral clearance Cb that is set according to the height of the clearance target component 3a of the related art, the peripheral clearance Cb of the present embodiments is small. Then, the volume of the hollow V formed in the area of its peripheral clearance Cb can be reduced, thereby improving the heat radiation performance.

The recessed portion of the present embodiments could be formed for each position on the inner wall surface side of the enclosure member, which faces the heat-generating component. Also one recessed portion might be formed for a plurality of heat-generating components (heat-generating components which are positioned close to each other). However, it is preferable to properly set a shape, a size, a depth and a forming position of the recessed portion according to a shape, a size, a height and a mounting position of the heat-generating component. For instance, in the case where at least a part of the heat-generating component is positioned in the recessed portion and encircled and wrapped with the inner wall surface of the recessed portion, an opening shape and a bottom shape of the recessed portion are set to be greater than a horizontally-cut cross section shape (a horizontally-cut cross section shape of the encircled and wrapped portion) of the heat-generating component so as to secure a predetermined component clearance between the heat-generating component located in the recessed portion and the inner wall surface (a bottom surface etc.) of the recessed portion. Further, by shaping a side wall surface of the inner wall surface into a reverse-tapered shape (a diverging shape), the recessed portion whose opening area is greater than whose bottom wall area is formed.

In addition, a structure or configuration, in which a partition wall that protrudes from the recessed portion toward each heat-generating component is interposed between the heat-generating components encircled and wrapped by the recessed portion (with a clearance given so as not to interfere with each heat-generating component), could be employed. According to such structure, a part (i.e. the partition wall) of the enclosure member can be located close to each heat-generating component, thereby further improving the heat radiation performance.

Furthermore, in the case where one recessed portion is formed for the plurality of heat-generating components whose shapes (thickness, size etc.) are different and which are adjacent to each other, a shape of a bottom wall surface of the recessed portion is not limited to a flat surface. For instance, in a case where each height of the heat-generating components is different, the bottom wall surface of the recessed portion is formed into a stepped shape according to each height of the heat-generating components so as to secure the component clearance.

The heat radiation member could be disposed in the component clearance between the inner wall surface of the recessed portion and the heat-generating component. As this heat radiation member, material used in the field of the electronic control apparatus can be used. For instance, it is a heat radiation member formed from silicon resin material and having elasticity. Further, besides the heat radiation member having the elasticity, it is preferable to use a heat radiation member having adhesiveness which is interposed in the clearance and suppresses position shift (slippage or misalignment) and outflow of the heat radiation member. It is also preferable to use a heat radiation member that has environmental resistance and can hold the heat radiation performance for a long time. In the present embodiments, since the heat radiation member disposed in the component clearance is encircled and wrapped with the inner wall surface of the recessed portion, it is possible to suppress the position shift (slippage or misalignment) and the outflow of the heat radiation member from the component clearance.

Here, in the case, like the related art, where the heat radiation member is interposed between the protruding portion and the heat-generating component, it is possible to suppress the outflow etc. of the heat radiation member by providing a protrusion at a peripheral edge portion of the protruding portion (Patent Document 1 etc.). However, it is required to provide the component clearance also between this protrusion and the heat-generating component, and this causes increase of the peripheral clearance. Although there is a method in which much heat radiation member is previously interposed in light of the outflow of the heat radiation member (so as to remain in the component clearance, even if some outflow occurs), this brings about high cost due to increase of the heat radiation member.

Further, a position of the recessed portion of the present embodiments is not limited to the position facing the heat-generating component. For instance, the recessed portion could be formed in a position facing an electronic component (hereinafter, called non-heat-generating component) except the heat-generating component. With this structure, even if the non-heat-generating component has a relatively high component, the component clearance of the non-heat-generating component is easily secured, and also the peripheral clearance can be easily narrow. Here, there is no need to interpose the heat radiation member in the component clearance of this non-heat-generating component.

Although a shape of the outer wall surface side of the enclosure member, where the recessed portion is formed, is not particularly limited, the outer wall surface is formed into a shape reflecting a shape of the recessed portion on the inner wall surface side of the enclosure member. For instance, the outer wall surface side of the enclosure member, where the recessed portion is formed, is formed into a protruding shape, and the outer wall surface side in an area of the peripheral clearance of the enclosure member is formed into a recessed shape. Further, in a case where a heat radiation fin (e.g. a pin-shaped or a rectangular heat radiation fin that protrudes from a recessed portion bottom surface) is provided on the outer wall surface side of the enclosure member, a heat radiation surface area can increase, then the heat radiation can be facilitated. A shape of this heat radiation fin is not particularly limited. For example, in a case where a plurality of heat radiation fins are provided, by adjusting their heights, appearance of the enclosure is enhanced, and the heat radiation performance is improved without increasing a size of the electronic control apparatus.

Although material used for the enclosure member is not particularly limited, it is preferable that the enclosure member where the recessed portion is formed be made of material having high heat conductivity. For instance, the recessed portion is integrally formed by molding and casting (e.g. die casting) metal material (such as aluminium and iron) into a desired shape. In addition, with the aim of increasing a thermal emissivity from the surface of the enclosure member, for instance, the enclosure member surface could be subjected to thin-layer insulating treatment (e.g. surface treatment of anodized aluminum, coating of cationic electrodeposition).

In a case where not a little deformation of the enclosure member and the circuit board might occur due to thermal deformation, bending deformation, deformation by vibration and enclosure internal pressure deformation, the component clearance and the peripheral clearance are properly formed with consideration given to deformation amount (deformation degree). For instance, it is conceivable that even if the deformation amount in a position close to a fixing point of the enclosure member and the circuit board is relatively small, the deformation amount in other positions except the position close to the fixing point (i.e. the deformation amount in a position apart from the fixing point) is relatively large. Therefore, the component clearance and the peripheral clearance could be set to sufficiently great sizes (sufficiently great distances) with increase in a distance from the fixing point.

Further, in addition to the recessed portion formed as described above, by providing a breathing filter at the enclosure member and/or the circuit board, the heat radiation performance can be improved. For instance, the breathing filter is provided at the peripheral edge side of the recessed portion in the enclosure member, which faces the heat-generating component. Also, since a back side of the circuit board, positioned in a mounting position of the heat-generating component, is also a heating part that becomes high temperature by the heat-generating component, the breathing filter could be provided at a portion in the enclosure member, which faces the heating part. This breathing filter is not particularly limited. A so-called snap-fit type breathing filter or a welding (sealing) type breathing filter can be employed as necessary.

Regarding the heat-generating component and the non-heat-generating component, both are mounted with these components spaced apart from each other a predetermined distance, then the peripheral clearance is formed as described above. With this structure or configuration, the heat-generating component is brought into a state in which the heat-generating component is thermally isolated from the non-heat-generating component.

<Configuration of Electronic Control Apparatus>

Figure 1:
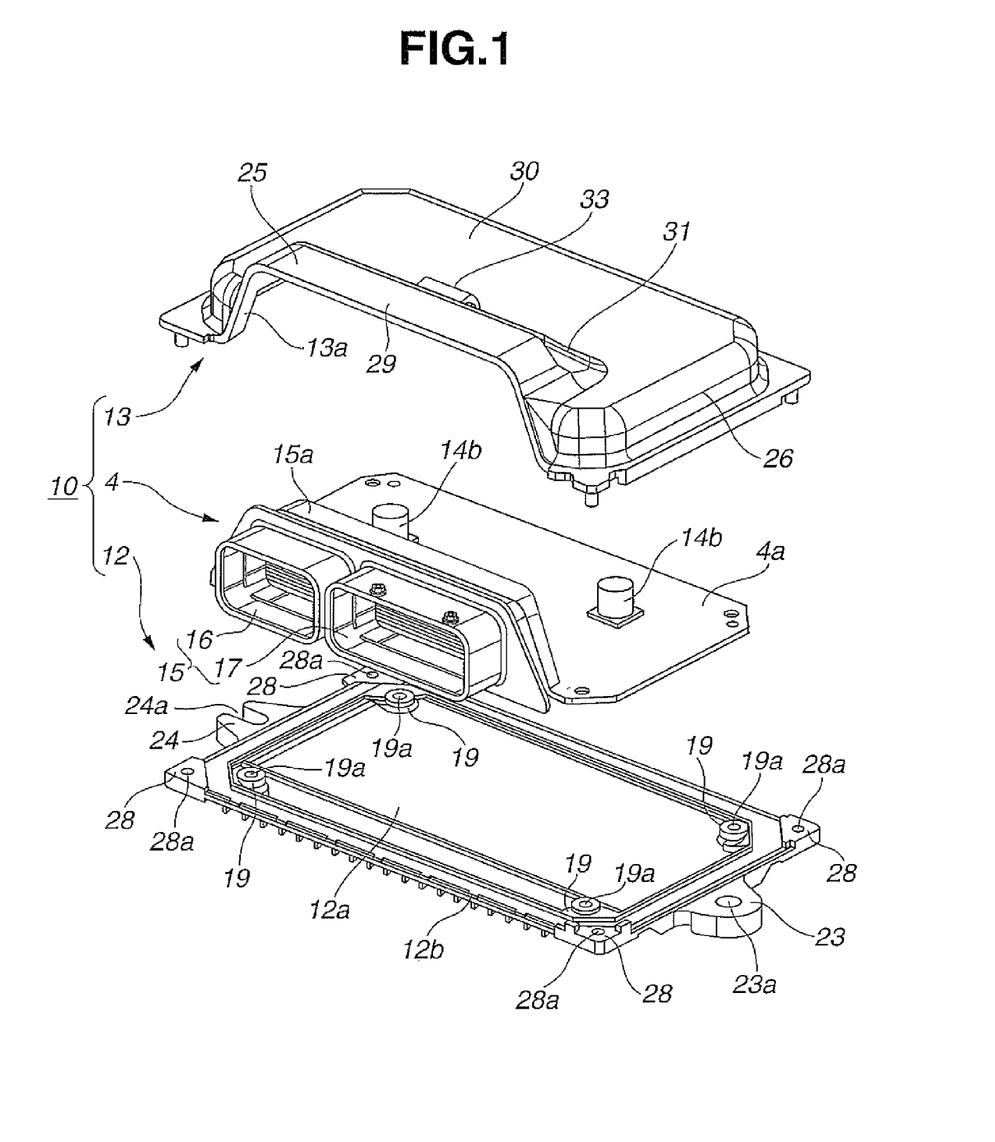
FIG. 1 is a perspective exploded view (a perspective view, viewed from an upper side) showing an example of an electronic control apparatus of the present embodiment.
Figure 2:
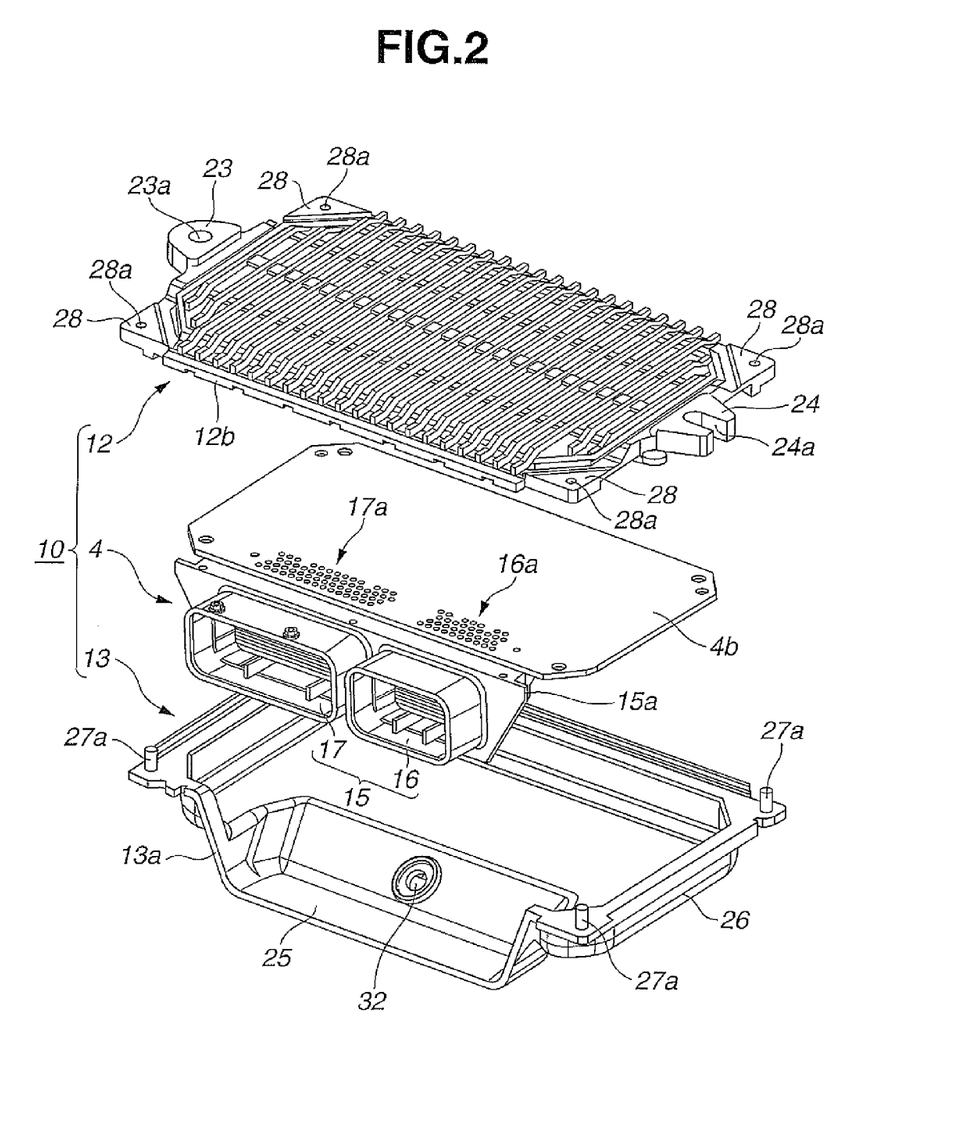
FIG. 2 is a perspective exploded view (a perspective view, viewed from a lower side) showing the example of the electronic control apparatus of the present embodiment.

In the following description, the electronic control apparatus of the present embodiments, which is applied to an engine control unit of a vehicle, will be explained with reference to the drawings. First, a basic structure or configuration of an electronic control apparatus 10, in which a circuit board 4 is accommodated in a space inside an enclosure that is formed by connecting a plurality of enclosure members (after-mentioned case 12 and cover 13 etc.) together, will be explained with reference to FIGS. 1 to 4. Here, for the sake of convenience, the explanation is made with an up-and-down direction in FIG. 1, i.e. a thickness direction of the circuit board 4 being an up-and-down direction of the electronic control apparatus 10. However, this does not necessarily correspond to a vertical direction of the electronic control apparatus 10 in a mounting state in the vehicle. For instance, in a case where the electronic control apparatus 10 is longitudinally mounted in the vehicle, the up-and-down direction of the electronic control apparatus 10 in FIG. 1 corresponds to a back-and-forth direction of the vehicle. Further, in the explanation in FIGS. 1 to 4, for the sake of convenience, explanation of a recessed portion, a heat-generating component, a heat radiation member, etc. is omitted, and these will be explained later in each embodiment.

This electronic control apparatus 10 is substantially formed from the enclosure formed by liquid-tightly connecting the almost plate-shaped case 12 that is fixed to a vehicle body side and the almost box-shaped cover 13 (through a sealing member) and the circuit board 4 that is accommodated in a protective space inside this enclosure and mounts thereon various electronic components (aftermentioned heat-generating component 3 and non-heat-generating component 14b etc.). Although there is no drawing showing a mounting state of the electronic control apparatus 10 in an engine room etc., the electronic control apparatus 10 is fixed to the vehicle body side by each bottom surface, which is a fixing surface to the vehicle body side, of brackets 23, 24 of the case 12. Here, in the present embodiments, although each fixing surface of the brackets 23, 24 to the vehicle body side is formed parallel to a bottom surface of the case 12, the fixing surfaces of the brackets 23, 24 could be formed so as to be inclined with respect to the bottom surface of the case 12, depending on a shape of a fixing portion (the brackets 23, 24) to the vehicle body side.

Each component will be explained in detail. The circuit board 4 is a so-called printed wiring board whose upper side surface 4a (a surface on a cover 13 side) mounts thereon the non-heat-generating component 14b, such as capacitor and coil, which does not tend to generate the heat (i.e. whose heat generation is relatively small) and which does not require a special heat radiation treatment such as a heat sink, and whose lower side surface 4b (a surface on a case 12 side) mounts thereon the heat-generating component 3, such as processing unit, transistor and IC, which tends to generate the heat (i.e. whose heat generation is relatively large). A wiring circuit pattern is formed on front and back surfaces of a plate member made of, for instance, glass epoxy resin or formed in its inside, and the heat-generating component 3 and the non-heat-generating component 14b are each electrically connected to this wiring circuit pattern by soldering.

Further, a connector 15 having two connecting ports; first and second connecting ports 16, 17, to which external connectors are respectively connected, is fixed to a part of a peripheral edge side of the circuit board 4. This connector 15 is a connector in which the first and second connecting ports 16, 17 separated into two according to external connectors are fixedly connected through a mounting base portion 15a. The first and second connecting ports 16, 17 are fixed to the circuit board 4 through this mounting base portion 15a (for instance, with a plurality of screws). The connector 15 is configured so that a set of connecting ports 16, 17 fixed through the mounting base portion 15a opens or faces to the outside through a window 13a that is a space formed between the case 12 and the cover 13. The connector 15 is connected to a vehicle side connector at this window.

The connector 15 is provided with a plurality of male terminals 16a, 17a that are electrically connected to the wiring circuit pattern on the circuit board 4. These male terminals 16a, 17a are connected to a plurality of female terminals accommodated in the external connector (not shown), then the connector 15 is electrically connected to a certain device, such as a sensor and pump, which is connected to the female terminals of the external connector.

The case 12 is formed, as an integral component, by metal material such as aluminum having good thermal conductivity into an almost plate shape, more particularly, a shallow box shape whose peripheral edge slightly rises or stands. More specifically, a side wall 12b stands at an outer peripheral edge (each side) of an almost rectangular bottom wall 12a so that the case 12 as a whole opens upwardly. Cover fixing portions 28 to secure the cover 13 are formed at four corners of the side wall 12b. A penetration hole 28a penetrating the cover fixing portion 28 in the up-and-down direction is provided at each cover fixing portion 28.

Mounting and fixation of the circuit board 4 is made through a board fixing portion 19 that stands at a peripheral edge portion on an inner wall surface side of the bottom wall 12a of the case 12. This board fixing portion 19 has, at an upper end thereof, a flat supporting surface that supports the circuit board 4, and a female screw hole 19a into which a screw (not shown) for fixation of the circuit board 4 is screwed is formed at each supporting surface. By screwing the screw into the female screw hole 19a, the circuit board 4 is fixed to the case 12 with the circuit board 4 supported by each board fixing portion 19.

Figure 3:
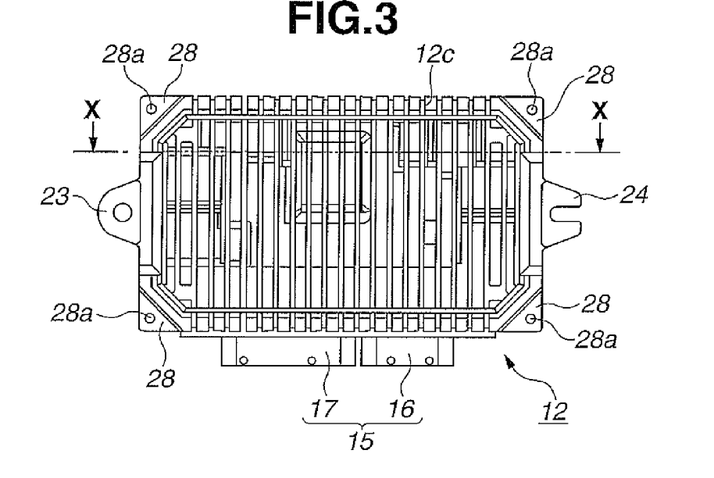
FIG. 3 is an explanatory drawing of a case 12, viewed from the lower side.
Figure 4:
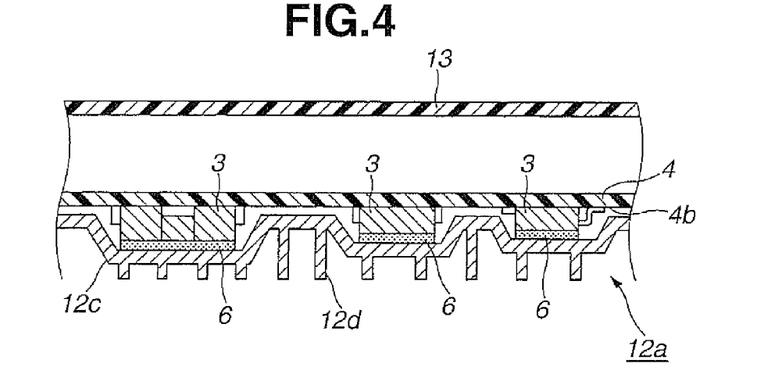
FIG. 4 is a local sectional view of the case 12 (a sectional view taken along a line X-X in FIG. 3).

Further, the pair of brackets 23, 24 for the fixation of the electronic control apparatus 10 to the vehicle body side (not shown) are formed integrally with the case 12 at outer side portions of the side wall 12b of the case 12. These brackets 23, 24 are respectively provided with a penetration hole 23a penetrating the bracket 23 in the up-and-down direction and a cutout groove 24a opening in an outward direction. The case 12 (the electronic control apparatus 10) is mounted and fixed to the vehicle body side with bolts that penetrate these penetration hole 23a and cutout groove 24a. As shown in FIGS. 3 and 4 (a part of a sectional view taken along a line X-X in FIG. 3), a plurality of rectangular heat radiation fins 12d are arranged parallel to each other at a predetermined interval on an outer wall surface 12c on a lower side of the bottom wall 12a of the case 12.

The cover 13 is formed, as an integral component, by predetermined synthetic resin material that is lighter and lower cost than the metal material into an almost box shape. The cover 13 has an upper wall portion 25 that covers upper sides of the circuit board 4 and the connector 15 and a side wall 26 that surrounds three sides of the upper wall portion 25, except the window 13a. Here, regarding the material used for the cover 13, although it is material (the synthetic resin material) that is different from the material (the metal material) of the case 12, the same material as the material of the case 12 could be used.

A positioning protrusion 27a having a shape that can penetrate and be fitted into the penetration hole 28a of the cover fixing portion 28 is formed in a position of the side wall 26, which faces the cover fixing portion 28 of the case 12. By penetrating and fitting the positioning protrusions 27a into the respective penetration hole 28a of the cover fixing portion 28, the cover 13 is fixed to the case 12 with the cover 13 supported by each cover fixing portion 28.

In order to ensure waterproof (water-resistance) at a coupling portion between an upper side peripheral edge portion of the case 12 and a lower side peripheral edge portion of the cover 13, a coupling portion between the upper side peripheral edge portion of the case 12 and a lower side peripheral edge portion of the connector 15 and a coupling portion between an outer peripheral portion of the connector 15 and an inner peripheral edge portion of the window 13a, these coupling portions are liquid-tightly coupled together through sealing material. Although there is no detailed drawing, in a case where the coupling portion is a flat surface, by a sealing structure in which a flat surface seal is formed, desired sealing performance can be obtained. In addition, one side of the coupling portion is provided with a seal groove, and the other side of the coupling portion is provided with a protruding line, then by inserting and fitting the protruding line into the seal groove with a gap provided, desired sealing performance can be obtained while sufficiently securing a length of the sealing material filled in the gap between the seal groove and the protruding line, i.e. a seal length. Here, as the sealing material, it is not particularly limited as long as the sealing material has fluidity. For instance, epoxy seal material, silicon seal material, acrylic seal material, etc. could be properly used according to specifications and requirements of the electronic control apparatus 10.

As explained above, this electronic control apparatus 10 has a structure in which the connector 15 opening to the outside is fixed to one end of the circuit board 4. For this reason, the cover 13 has a stepped shape according to shapes of the circuit board 4 and the connector 15 which are different in size (length) in the thickness direction of the circuit board. More specifically, the upper wall portion 25 of the cover 13, which faces the case 12 and sandwiches the circuit board 4 and the connector 15 with the case 12, has an upper step section 29 and a lower step section 30, which are formed parallel to the fixing surface (the board fixing portion) 19 of the case 12. A size (height), in the thickness direction of the circuit board, of the upper step section 29 covering the upper side of the connector 15 is greater (higher) than that of the lower step section 30 covering the upper side of the circuit board 4. Then, an inclined wall section 31 that smoothly connects these upper step section 29 and lower step section 30 which are different in height is formed. This inclined wall section 31 has a flat inclination of a predetermined inclination angle, e.g. an angle of approx. 45 degrees, with respect to the bottom wall 12a of the case 12. Thus, the inclined wall section 31 is inclined at this same inclination angle with respect to the upper step section 29 and the lower step section 30. Further, in order to protect an air vent 32 formed in the thickness direction with the aim of providing the breathing filter, a protection wall 33 is formed at the inclined wall section 31. The air vent 32 is a vent in which a thin permeable waterproof filter (or film) (not shown) such as Gore-Tex (registered trade mark) having both of the waterproof and the permeability is attached. The air vent 32 is protected by the protection wall 33 so that for instance, high temperature and high pressure water is not directly splashed on the permeable waterproof filter during car wash.

Next, the embodiments of a heat radiation portion of the electronic control apparatus 10 will be explained.

Embodiment 1

Figure 5:
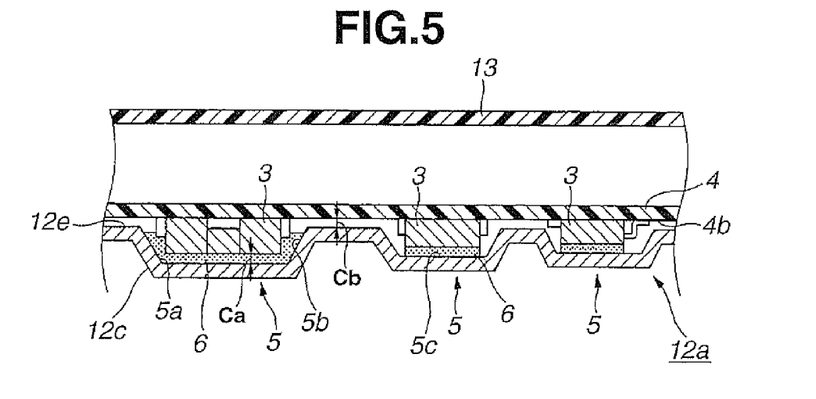
FIG. 5 is an explanatory drawing of an electronic control apparatus in which a recessed portion according to an embodiment 1 is formed.

FIG. 5 is an explanatory drawing (a part of a sectional view taken along the line X-X in FIG. 3, for the sake of convenience, the heat radiation fin 12d is omitted here) showing an example of the electronic control apparatus in which the recessed portion is formed. A plurality of the heat-generating components 3 whose heights are different are mounted on the lower side surface (the surface on the case 12 side) 4b of the circuit board 4. Further, the recessed portions 5 are formed in positions facing the respective heat-generating components 3, on an inner wall surface 12e side of the bottom wall 12a of the case 12. Each side wall surface 5b of an inner wall surface 5a of these recessed portions 5 is formed into the reverse-tapered shape (the diverging shape), and covers (encircles and wraps) an outer peripheral side of the heat-generating component 3 by the inner wall surface 5a. In addition, between the inner wall surface 5a of the recessed portion 5 and the heat-generating component 3, a predetermined-sized component clearance Ca is provided. Between the lower side surface 4b of the circuit board 4 and the inner wall surface 12e of the bottom wall 12a on the peripheral edge side of the recessed portion 5, the peripheral clearance Cb is provided.

Here, a heat radiation member 6 could be interposed in a position of the component clearance Ca as necessary. For example, as shown in the drawing, the heat radiation member 6 is interposed between a top end of the heat-generating component 3 and a bottom wall surface 5c in the recessed portion 5. Or alternatively, the heat radiation member 6 could be filled in the recessed portion 5. Further, a surface of the recessed portion 5 could be subjected to thin-layer insulating treatment (e.g. surface treatment of anodized aluminum, coating of cationic electrodeposition).

As shown in FIG. 5, by forming, in the case 12, the recessed portion in the position facing or corresponding to the heat-generating component 3, it is possible to set the peripheral clearance Cb on the peripheral edge side of the heat-generating component 3 to be narrow, then the heat from the heat-generating component 3 can be easily conducted to the case 12 side, thereby improving the heat radiation performance. Further, in the case where the heat radiation member is interposed in the recessed portion 5, since the heat radiation member is surrounded by the inner wall surface 5a of the recessed portion 5, it is possible to suppress the position shift (slippage or misalignment) and the outflow of the heat radiation member, and the high cost can be suppressed.

Embodiment 2

Figure 6:
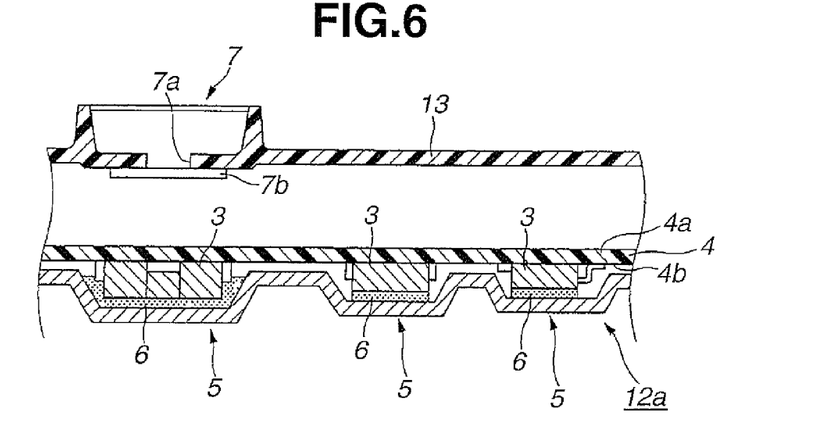
FIG. 6 is an explanatory drawing of the electronic control apparatus in which a recessed portion according to an embodiment 2 is formed.
Figure 7:
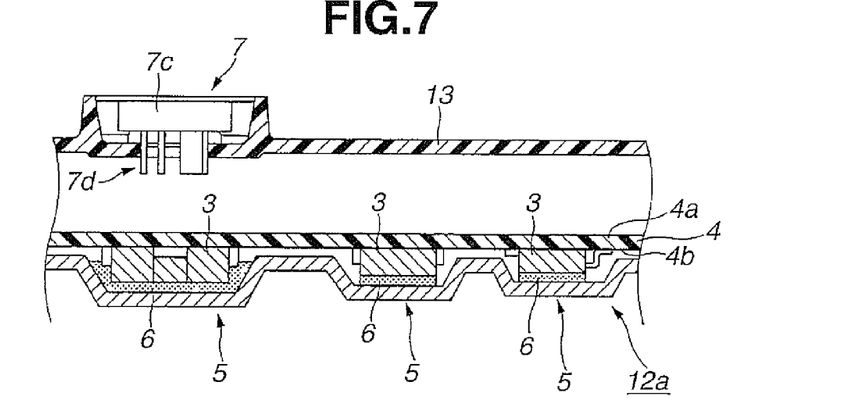
FIG. 7 is an explanatory drawing of the electronic control apparatus in which the recessed portion according to the embodiment 2 is formed.

FIGS. 6 and 7 are schematic views for explaining modification examples of the embodiment 1. FIG. 6 shows an example in which the cover 13 is provided with a welding (sealing) type breathing filter 7. The breathing filter 7 is set in a position facing a heating part (the upper side surface 4a) of the circuit board 4 on an upper side (a back surface side) of the heat-generating component 3. This breathing filter 7 has an air vent 7a formed in the cover 13 and a thin permeable waterproof filter (or film) 7b attached to the air vent 7a. FIG. 7 shows an example in which the cover 13 is provided with a snap-fit type breathing filter 7. The snap-fit type breathing filter 7 has a filter body 7c having permeability and water-resistance and a snap-fit portion 7d connecting and holding the filter body 7c to the cover 13 in a so-called snap-fitting manner.

By providing the breathing filter 7 as shown in FIGS. 6 and 7, for instance, the heat existing between the circuit board 4 and the cover 13 without being radiated from the recessed portion 5 is easily radiated to the outside of the enclosure by the breathing filter 7, thereby improving the heat radiation performance.

Embodiment 3

Figure 8:
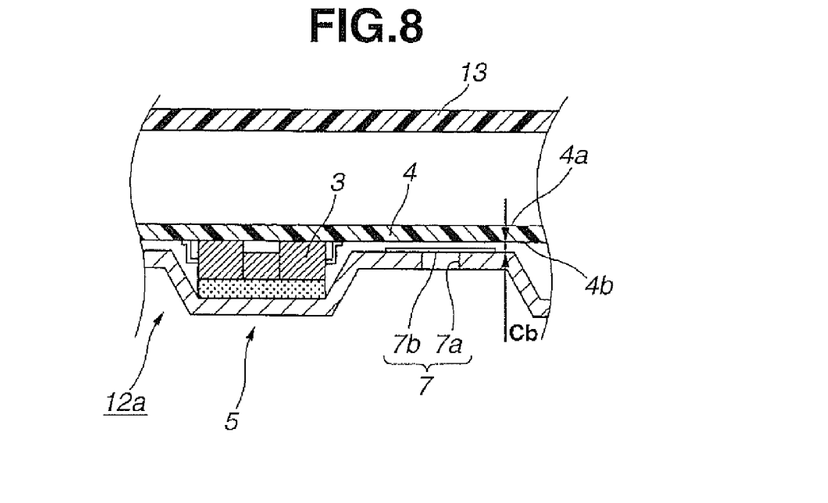
FIG. 8 is an explanatory drawing of the electronic control apparatus in which a recessed portion according to an embodiment 3 is formed.
Figure 9:
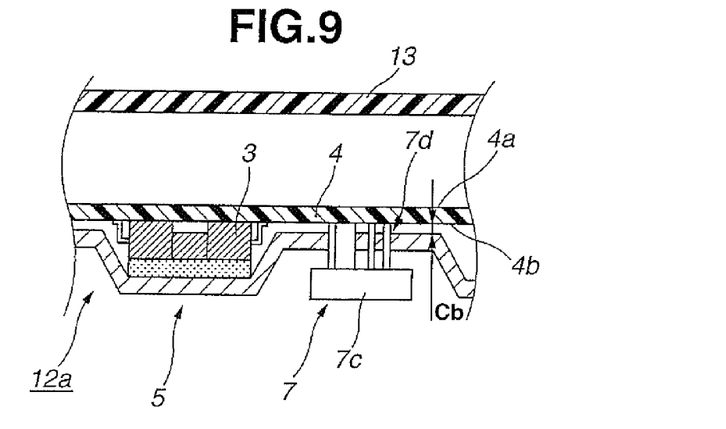
FIG. 9 is an explanatory drawing of the electronic control apparatus in which the recessed portion according to the embodiment 3 is formed.

FIGS. 8 and 9 are schematic views for explaining modification examples of the embodiment 2. In FIG. 8, the welding (sealing) type breathing filter 7 is provided in a position of an area of the peripheral clearance Cb at the bottom wall 12a. FIG. 9 shows an example in which the snap-fit type breathing filter 7 is provided. In the same manner as FIG. 8, the snap-fit type breathing filter 7 is provided in a position of an area of the peripheral clearance Cb at the bottom wall 12a.

By providing the breathing filter 7 as shown in FIGS. 8 and 9, for instance, the heat existing in the area of the peripheral clearance Cb without being radiated from the recessed portion 5 is easily radiated to the outside of the enclosure by the breathing filter 7, thereby improving the heat radiation performance.

Embodiment 4

Figure 10:
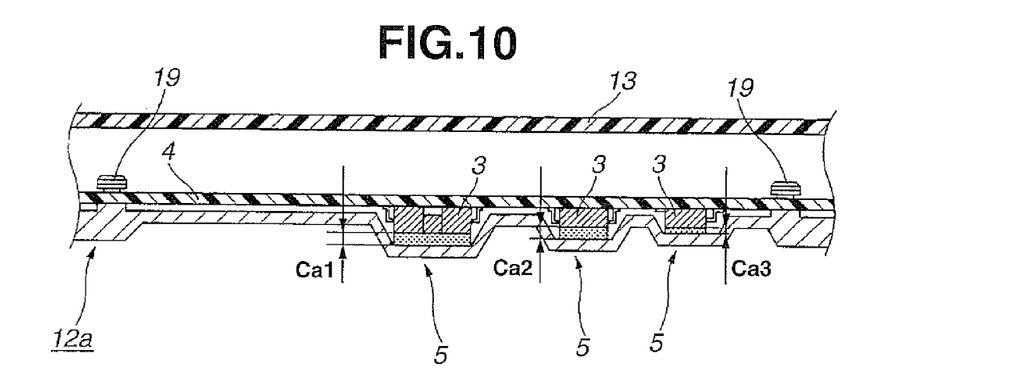
FIG. 10 is an explanatory drawing of the electronic control apparatus in which a recessed portion according to an embodiment 4 is formed.

FIG. 10 is a schematic view for explaining a modification example of the embodiment 1, and shows an example for setting the component clearance on the assumption that the enclosure member and the circuit board might be deformed. In this example, the component clearances Ca1 to Ca3 for the respective heat-generating components 3 are set so as to satisfy a relationship of Ca1>Ca2>Ca3, namely that the component clearances are set so that as a distance from the board fixing portion 19 to a component clearance setting position becomes larger, the component clearance gradually becomes greater.

By setting the component clearances Ca1 to Ca3 for the respective heat-generating components 3 according to the distance from the board fixing portion 19 as shown in FIG. 10, a sufficient component clearance for the deformation of the bottom wall 12a and the circuit board 4 due to the thermal deformation etc. can be set. For instance, while suppressing interference of the heat-generating component 3 with the bottom wall 12a without increasing a hollow in the area of the peripheral clearance Cb, the heat radiation performance can be improved.

Embodiment 5

Figure 11:
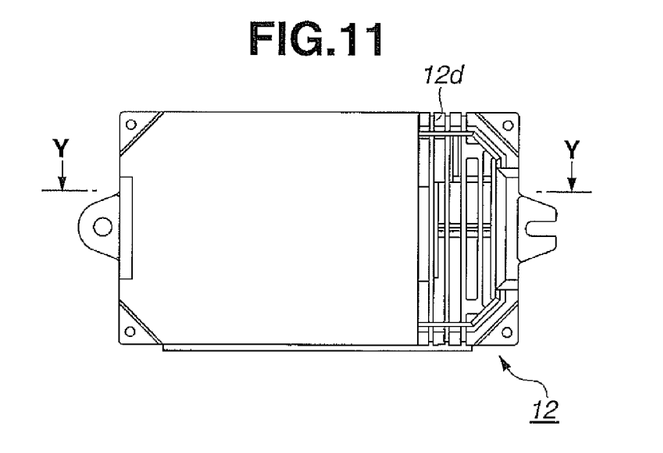
FIG. 11 is an explanatory drawing of the electronic control apparatus in which a recessed portion according to an embodiment 5 is formed.
Figure 12:
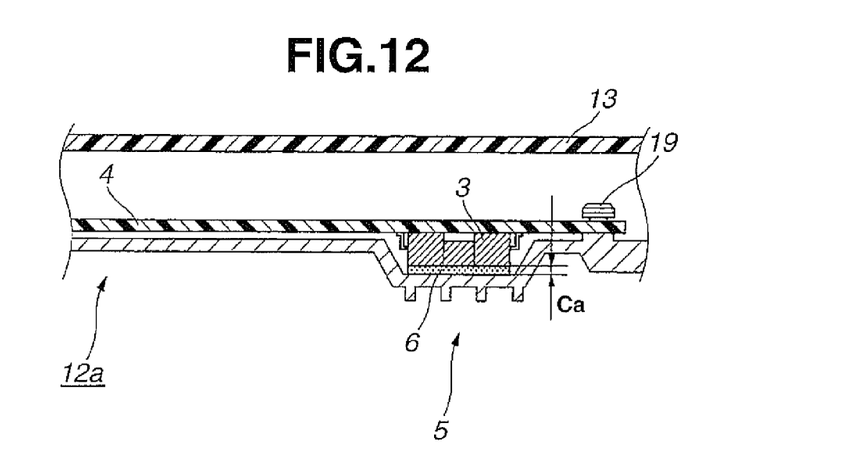
FIG. 12 is an explanatory drawing of the electronic control apparatus in which the recessed portion according to the embodiment 5 is formed (a sectional view taken along a line Y-Y in FIG. 11).

FIGS. 11 and 12 (a part of a sectional view taken along a line Y-Y in FIG. 11) are schematic views for explaining a modification example of the embodiment 4. FIG. 12 shows an example in which the heat-generating component 3 is mounted in a predetermined area so as to be spaced apart from other electronic components (the non-heat-generating component etc.) at a certain distance, more specifically, the heat-generating component 3 is mounted in an area close to the board fixing portion 19 on the circuit board 4, and the recessed portion 5, the component clearance Ca and the heat radiation fin 12d are provided according to the mounted heat-generating component 3.

By mounting the heat-generating component 3 as shown in FIGS. 11 and 12, a distance from the other electronic components (an area of a wider peripheral clearance) can be secured, thus an influence of the heat generated by the heat-generating component on the other electronic components can be suppressed. Further, by mounting the heat-generating component 3 in the area close to the board fixing portion 19, for instance, while suppressing interference of the heat-generating component 3 with the bottom wall 12a without increasing a hollow in the area of the peripheral clearance Cb, the heat radiation performance can be improved.

Here, the inventors carried out analysis of a temperature ΔT of a maximum heating part in an operating state of the electronic control apparatus as shown in FIGS. 1 to 4 in which the recessed portion as shown in the embodiments 1 to 5 is formed, by a CAE thermal analysis. A result obtained is as follows. In the case of the related art electronic control apparatus, for instance, the temperature ΔT is 35.5° C., whereas in the case of the electronic control apparatus of the present embodiments 1 to 5, for instance, the temperature ΔT is 33.0° C.~30.7° C. From this CAE thermal analysis result, it can be judged that as compared with the related art electronic control apparatus, according to the electronic control apparatus of the present embodiments, the radiation performance can be improved by about a few percent ~a few tens of percent.

Although the present invention has been explained by reference to the certain embodiments described above, the structure or configuration of the present invention is not limited to the embodiments described above. The present invention includes all design modifications and equivalents belonging to the technical scope of the present invention.

The invention claimed is:

1. An electronic control apparatus accommodating, in a space inside an enclosure formed by connecting a plurality of enclosure members together, a circuit board on which a plurality of heat-generating electronic components that generate heat are mounted, comprising:
    a recessed portion formed in a position facing each heat-generating electronic component in the enclosure member that faces each heat-generating electronic component, and
    a component clearance being formed between an inner wall surface of the recessed portion and each heat-generating electronic component,
    a peripheral clearance, which is set with a distance from an opening edge of the recessed portion to the circuit board being a reference, being formed between the circuit board and the enclosure member on at least one peripheral edge side of each heat-generating electronic component, and
    hollows disposed between the plurality of heat-generating electronic components communicating with each other through the peripheral clearance.

2. The electronic control apparatus as claimed in claim 1, wherein:
    a heat radiation member is interposed between the recessed portion and each heat-generating electronic component.

3. The electronic control apparatus as claimed in claim 1, wherein:
    at least a part of each heat-generating electronic component is encircled by the inner wall surface of the recessed portion.

4. The electronic control apparatus as claimed in claim 1, wherein the recessed portion projects below all other portions of the enclosure member.

* * * * *